(12) United States Patent
Yun et al.

(10) Patent No.: US 12,400,933 B2
(45) Date of Patent: Aug. 26, 2025

(54) JET IMPINGEMENT HEATSINK FOR HIGH POWER SEMICONDUCTOR DEVICES

(71) Applicant: SEMICONDUCTOR COMPONENTS INDUSTRIES, LLC, Phoenix, AZ (US)

(72) Inventors: Changsun Yun, Seoul (KR); Oseob Jeon, Seoul (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 216 days.

(21) Appl. No.: 18/167,929

(22) Filed: Feb. 13, 2023

(65) Prior Publication Data

US 2024/0274506 A1 Aug. 15, 2024

(51) Int. Cl.
*H01L 23/46* (2006.01)
*H01L 23/473* (2006.01)

(52) U.S. Cl.
CPC .................. *H01L 23/4735* (2013.01)

(58) Field of Classification Search
CPC .................................................. H01L 23/4735
See application file for complete search history.

(56) References Cited

U.S. PATENT DOCUMENTS

| 9,484,283 | B2 | 11/2016 | Joshi et al. |
| 10,224,562 | B2 | 3/2019 | Zuhara et al. |
| 10,533,809 | B1* | 1/2020 | Sherrer ............... H01L 23/4735 |
| 10,727,639 | B2* | 7/2020 | Killi ..................... H01S 3/0405 |
| 2008/0037221 | A1 | 2/2008 | Campbell et al. |
| 2020/0027819 | A1 | 1/2020 | Smith et al. |
| 2021/0111100 | A1* | 4/2021 | Galloway ........... H01L 23/4735 |

OTHER PUBLICATIONS

International Search Report for counterpart International Application No. PCT/US2023/079648, mailed Apr. 5, 2024, 13 pages.

* cited by examiner

*Primary Examiner* — Mukundbhai G Patel
(74) *Attorney, Agent, or Firm* — Brake Hughes Bellermann LLP

(57) ABSTRACT

A jet impingement cooling assembly for semiconductor devices may include a heat exchange base having an inlet chamber and an outlet chamber, an inlet connection in fluid connection with the inlet chamber, and an outlet connection in fluid connection with the outlet chamber. A plurality of jet nozzles may be attached to a semiconductor module, with the plurality of jet nozzles including corresponding openings positioned to cause jet impingement of fluid flow from the inlet chamber onto the semiconductor module and then into the outlet chamber.

20 Claims, 21 Drawing Sheets

Fluid velocity contour (top view)

Fluid velocity contour (front view)

Fluid velocity contour (top view)

Fluid velocity contour (Front view)

Fluid velocity contour (top view)

Fluid velocity contour (front view)

JET IMPINGEMENT HEATSINK FOR HIGH POWER SEMICONDUCTOR DEVICES

TECHNICAL FIELD

This description relates to cooling techniques for semiconductor devices.

BACKGROUND

High power semiconductor devices, during operation, generate heat that may be harmful to the devices themselves, or to nearby components. For example, excess heat may cause an abrupt device breakdown, or may contribute to shortening of a device lifetime.

Conventional cooling techniques for high power semiconductor devices include the use of thermal interface materials (TIM) between the devices and one or more heatsinks. However, a thermal conductivity of such TIMs may be insufficient for many use cases.

In other conventional approaches, liquid cooling systems may be used to cool high power semiconductor devices. For example, a pump may be used to direct a flow of water or other suitable cooling liquid to high-heat areas, to thereby facilitate heat transfer from the high-heat areas to the cooling liquid.

For example, in jet impingement cooling systems, jet nozzles may be used to direct cooling liquid directly onto a surface of a high-power semiconductor device being cooled. However, such jet nozzles may use very narrow diameters to generate sufficient jet velocity and pressure, so that the jet nozzles are prone to clogging. Moreover, such conventional jet impingement cooling systems tend to introduce large and unwanted pressure drops into an overall liquid cooling system. Although it is possible to enlarge the nozzle diameters to reduce clogging and pressure drops, doing so will typically deteriorate a heat dissipation performance of the cooling system.

SUMMARY

According to one general aspect, a jet impingement cooling assembly for semiconductor devices may include a heat exchange base having an inlet chamber and an outlet chamber, an inlet connection in fluid connection with the inlet chamber, and an outlet connection in fluid connection with the outlet chamber. The jet impingement cooling assembly for semiconductor devices may include a plurality of jet nozzles attached to a semiconductor module, the plurality of jet nozzles including corresponding openings positioned to cause jet impingement of fluid flow from the inlet chamber onto the semiconductor module and then into the outlet chamber.

According to another general aspect, a jet impingement heatsink for jet impingement cooling of at least one semiconductor device may include a jet plate configured to be received within a heat exchange base, and a plurality of jet nozzles attached to the jet plate and to the at least one semiconductor device. The jet plate and the plurality of jet nozzles, when received within the heat exchange base, may define a fluid flow from an inlet chamber of the heat exchange base through the plurality of jet nozzles and onto the at least one semiconductor device, and to an outlet chamber of the heat exchange base.

According to another general aspect, a method of making a jet impingement heatsink for semiconductor devices may include attaching a jet plate to a plurality of jet nozzles, and attaching the jet plate and the plurality of jet nozzles to at least one semiconductor device.

The details of one or more implementations are set forth in the accompa-nying drawings and the description below. Other features will be apparent from the description and drawings, and from the claims.

BRIEF DESCRIPTION OF THE DRAWINGS

FIG. 15B illustrates a front view of the example fluid velocity contour of

FIG. 15A.

DETAILED DESCRIPTION

As described in detail below, embodiments include a heat exchange assembly for performing jet impingement cooling of semiconductor power modules. In example implementations, jet nozzles are directly attached to both a semiconductor device being cooled, and to a heatsink, to thereby provide a jet impingement heatsink. Accordingly, the advantages of a jet impingement cooling system may be obtained together with the thermal dissipation of a heatsink. The jet impingement heatsink enables use of relatively wide jet nozzles, which reduces clogging of individual jet nozzles, and decreases a pressure drop exhibited across the jet impingement cooling system.

For example, conventional jet nozzles are positioned at a distance from a semiconductor power module being cooled, and direct a spray of cooling liquid across the distance and onto the semiconductor power module. Described techniques, however, directly attach one or more jet nozzles to the semiconductor power module, e.g., using solder or sinter. The jet nozzles are also directly attached to (e.g., soldered to, or formed integrally with) a heatsink, such as a metal heatsink, to provide a jet impingement heatsink. Consequently, described techniques provide cooling both through jet impingement of a cooling liquid, and through heatsink dissipation (thermal conduction). Therefore, described jet nozzles may be effective even with relatively wide jet nozzles and correspondingly lowered fluid velocity/pressure. As a result, the described jet nozzles may exhibit reduced clogging, while also improving a pressure drop associated with use of the jet impingement cooling system.

In specific examples, the described jet impingement cooling assembly may be used for cooling in the context of automobile or other engine applications. Such applications often have high power requirements within high-heat environments, while also meeting safety mandates.

Figure 1:
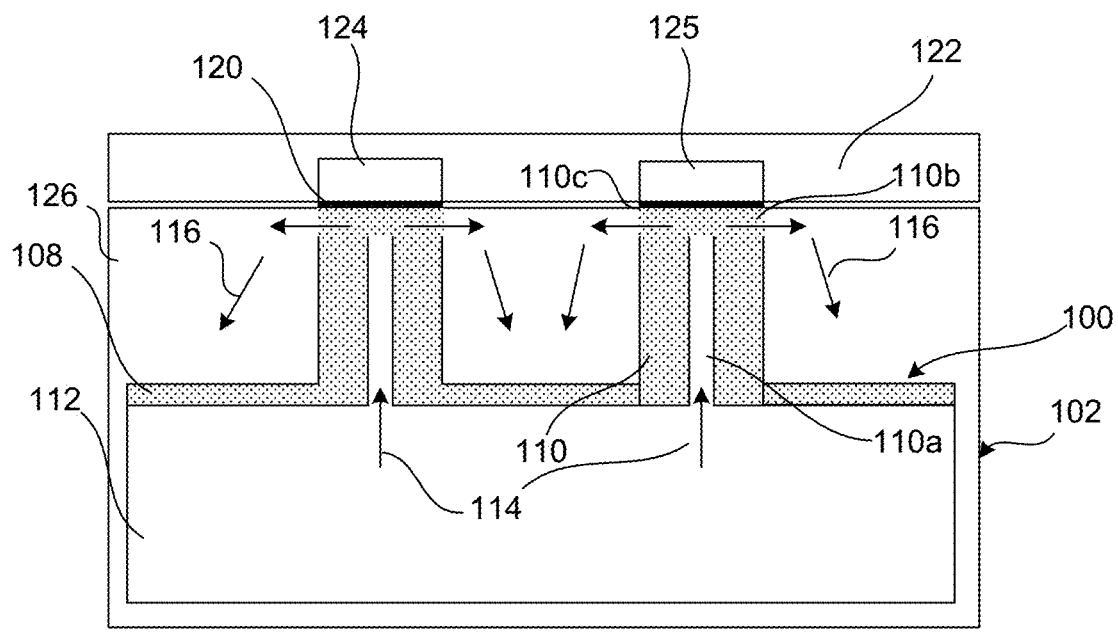
FIG. 1 is a cross-sectional view of a jet impingement heatsink for high power semiconductor devices.

FIG. 1 is a cross-sectional view of a jet impingement heatsink 100 for high power semiconductor devices. In FIG. 1, a heat exchange base 102 (which may be referred to, or include, a water jacket or cooling jacket) includes an inlet chamber 112 and an outlet chamber 126. Not visible in FIG. 1, but illustrated in the examples of FIGS. 17 and 18, the inlet chamber 112 may be in fluid connection with an inlet connection while the outlet chamber may be in fluid connection with an outlet connection. For example, the inlet connection and the outlet connection may be positioned in a z direction (i.e., out of the paper) with respect to FIG. 1. A fluid pump (also not illustrated in FIG. 1) may thus be used to establish a fluid flow through the heat exchange base 102.

For example, a fluid pump may pump an inlet fluid flow 114, e.g., a water flow, through the inlet connection, into the inlet chamber 112 as shown, and through a plurality of jet nozzles 110. The inlet fluid flow 114 may thereby continue as outlet fluid flow 116 that traverses through the outlet chamber 126 and proceeds to the outlet connection, and thus back to the fluid pump (perhaps after proceeding through various other intervening fluid loops). That is, the heat exchange base 102 for jet impingement cooling may be only part of a fluid loop used within a larger setting (e.g., within an automobile or other vehicle) to provide fluid-based heat dissipation to multiple components.

A jet plate 108 may be positioned within the heat exchange base 102. The jet plate 108 may be connected to, or formed integrally with, multiple jet nozzles 110. Together, the jet plate 108 and the jet nozzles 110 form the above-referenced jet impingement heatsink 100.

The pressurized inlet fluid flow 114 is forced through the jet nozzles 110 and impinged upon a semiconductor power module 122, in order to dissipate heat generated by operations of the semiconductor power module 122. The jet nozzles 110 may be sized, spaced, and positioned in any suitable or desired fashion with respect to the jet plate 108. The jet nozzles 110 may be any desired and suitable shape, such as, e.g., rectangular, rounded rectangular, circular, or ellipsoidal. The jet nozzles 110 may be formed within the jet plate 108 or may be attached or otherwise positioned on the jet plate 108, e.g., using a separate jet nozzle structure, which itself may have a desired and suitable width, length, and height, as described in more detail, below.

The semiconductor power module 122 may include a circuit board or other assembly of a plurality of semiconductor chips, or other devices, illustrated in FIG. 1 as example semiconductor devices 124 and 125. The various semiconductor power module devices 124, 125 may have heat signatures that range from high to negligible.

As referenced above, and illustrated in FIG. 1, the heat exchange base 102 is configured to receive the semiconductor power module 122, so that the jet nozzles 110 may be positioned to be directly below devices 124, 125 of the semiconductor power module 122. Consequently, the inlet fluid flow 114 may be forced through the jet nozzles 110 to impinge directly onto corresponding backsides of devices 124, 125 of the semiconductor power module 122. Such an approach provides highly-efficient and direct cooling of the devices 124, 125 of the semiconductor power module 122.

Following this jet impingement onto the devices 124, 125 of the semiconductor power module 122, the outlet fluid flow 116 may flow into the outlet chamber 126 and through the outlet connection. In this way, the outlet fluid flow 116 may thereby be provided to other elements being cooled, and ultimately return to the fluid pump being used.

In FIG. 1, each jet nozzle 110 includes an opening 110a (e.g., a vent, or a gap), a fluid channel 110b, and an attachment surface 110c. As shown, the opening 110a provides a passage for the pressurized inlet fluid flow 114 from the inlet chamber 112 and onto the semiconductor devices 124, 125. The fluid channel 110b provides a passage for the subsequent outlet fluid flow 116 to flow (after impingement upon the semiconductor devices 124, 125) into the outlet chamber 126. The attachment surface 110c provides a point of attachment by which the jet impingement heatsink 100 may be directly attached to the semiconductor power module 122, e.g., to corresponding ones of the semiconductor devices 124, 125, using a connection 120.

Figure 3:
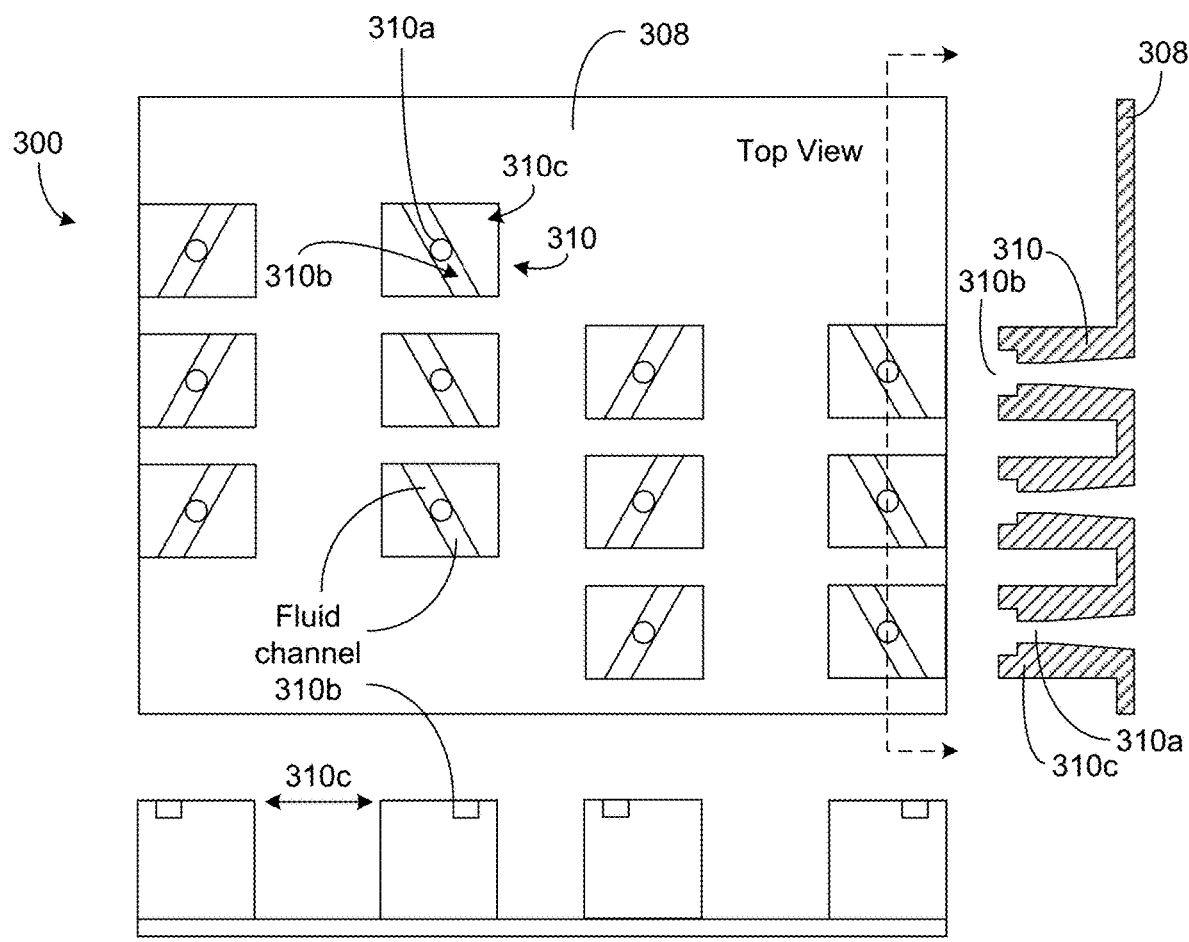
FIG. 3 illustrates a top view, a front view, and a cross-sectional view of an example implementation of the jet impingement heatsink for high power semiconductor devices of FIG. 1.
Figure 7:
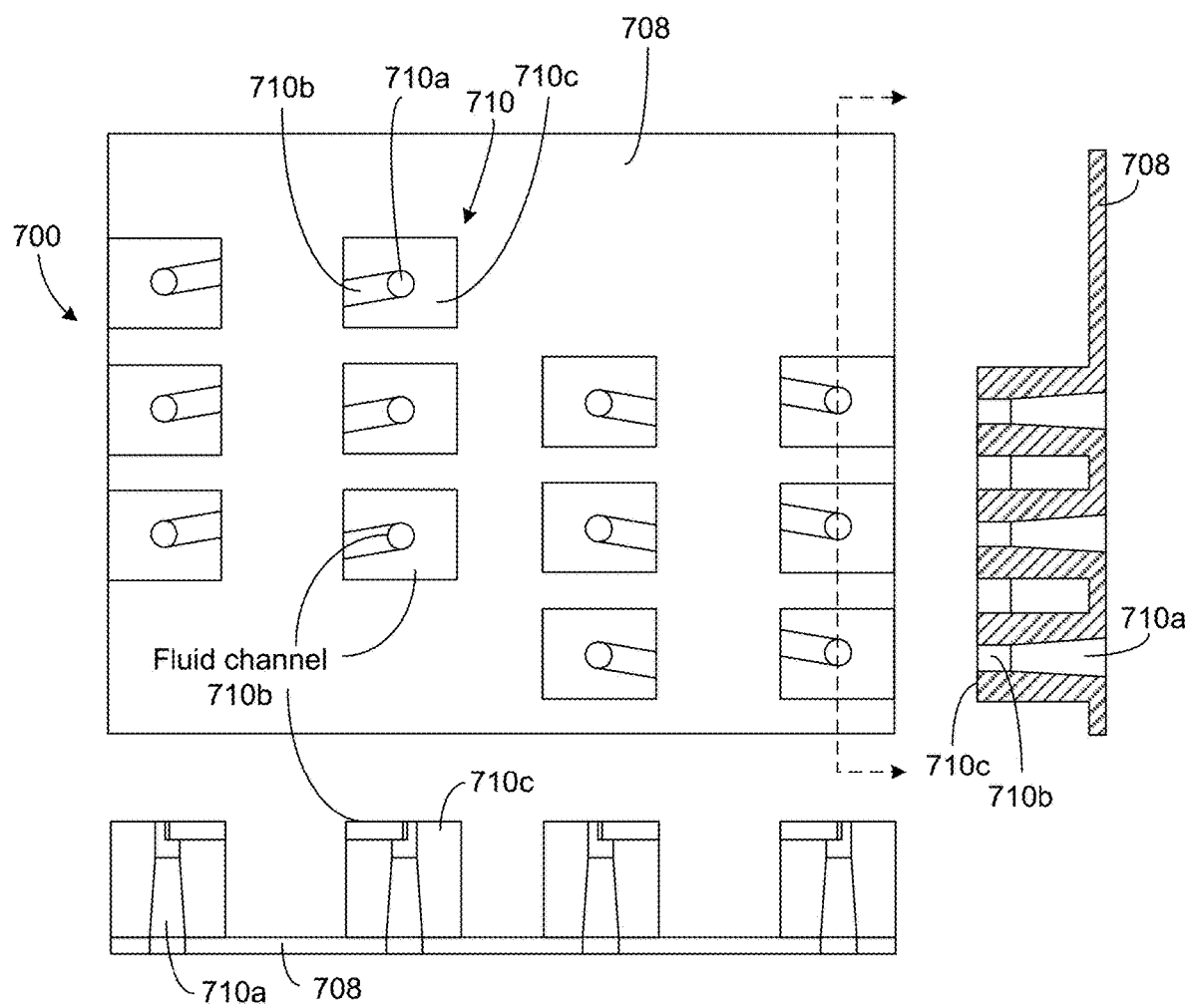
FIG. 7 illustrates a top view, a transparent front view, and a cross-sectional view of a second example implementation of the jet impingement heatsink for high power semiconductor devices of FIG. 1.
Figure 11:
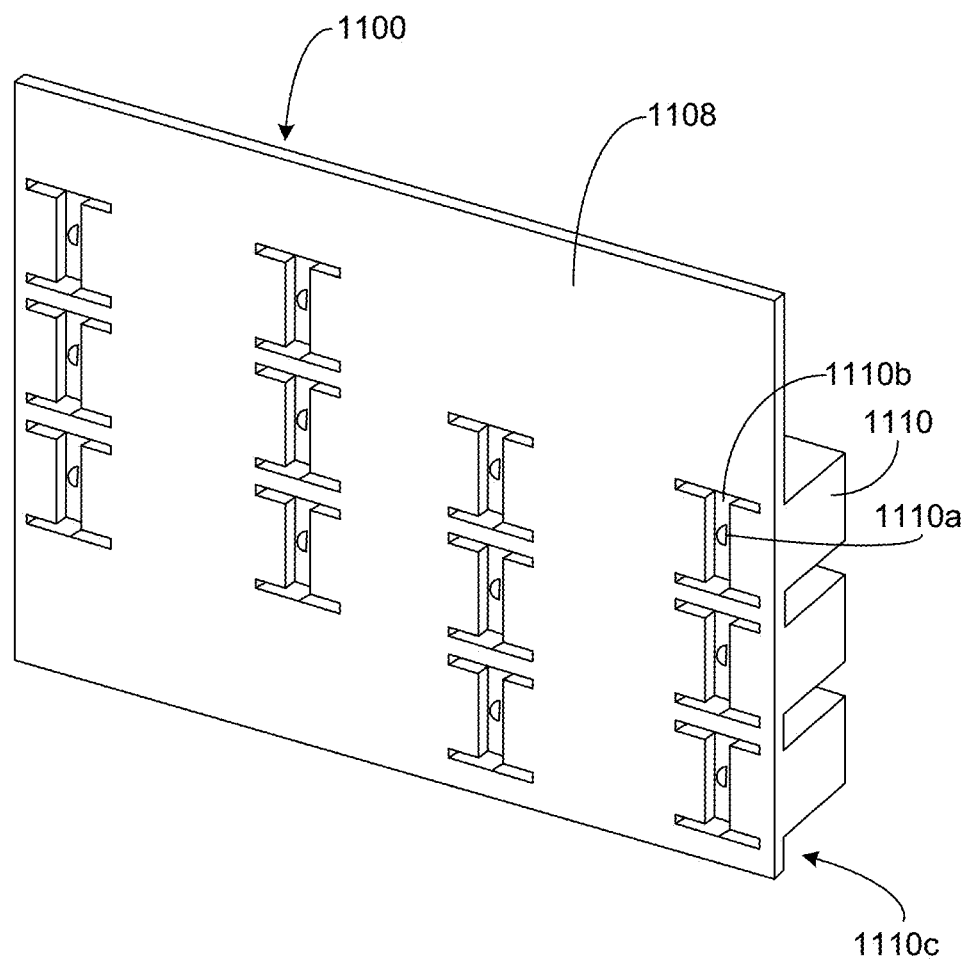
FIG. 11 illustrates an isometric view of a third example implementation of the jet impingement heatsink for high power semiconductor devices of FIG. 1.

For example, as illustrated in more detail in the example implementations of FIGS. 3, 7, and 11, the opening 110a may provide a cylindrical or tapered passage for the inlet fluid flow 114, which is vertical in the example of FIG. 1. The fluid channel 110b may then form a subsequent passage for the outlet fluid flow 116, as just described, with the fluid channel 110b being perpendicular to the opening 110a (e.g., horizontal in FIG. 1). The fluid channel may have a height that is defined as a difference or distance between the opening 110a and the attachment surface 110c, which may thus be referred to as the fluid channel height.

The attachment surface 110c may thus include, for example, a portion or surface of the jet nozzle 110 in which the fluid channel 110b is not formed. Accordingly, the connection 120, which may represent a solder or sinter connection, may be made between the attachment surface 110c and the semiconductor module 122. As the jet impingement heatsink 100 is formed of one or more materials capable of thermal conduction (e.g., a metal, such as copper), heat from the semiconductor devices 124, 125 may be directly dissipated, in addition to being dispersed by the action of the jet impingement provided by the jet nozzles 110 and associated flow of the fluid(s) 114/116.

In the example of FIG. 1, the jet plate 108 is attached to the inlet chamber 112 and positioned at a distal end of the jet nozzles 110 with respect to the semiconductor power modules 122. In other examples, however, such as in the examples of FIGS. 11-15B, the jet plate 108 may be positioned at a proximal end of the jet nozzles 110 with respect to the semiconductor power modules 122. Put another way, the jet impingement heatsink 100 may be constructed with the jet plate 108 positioned at any desired location along a length(s) of the jet nozzles 110.

Thus, as referenced, the described jet impingement heatsink 100 provides the above-referenced dual heat dissipation mechanisms, including liquid cooling through jet impingement as well as thermal dissipation through the thermally-conductive material of the jet impingement heatsink 100. In addition, the jet impingement heatsink 100 provides various other advantages over conventional cooling techniques, as well.

For example, in conventional jet impingement systems, diameters of jet nozzle openings may be required to be very narrow (e.g., on the order of hundreds of microns), in order to provide jet impingement with sufficiently high fluid velocity and pressure to obtain a desired level of cooling. Such small openings may be prone to clogging. Moreover, the high velocity/pressure of conventional jet impingement systems may lead to erosion of metals or metal coatings provided on semiconductor devices being cooled, which may be a concern in some contexts.

In contrast, since the jet impingement heatsink 100 of FIG. 1 provides dual cooling that includes thermal dissipation through the material of the jet impingement heatsink 100, a need for cooling provided by jet impingement may be reduced, as compared to conventional jet impingement systems. For example, a diameter of the opening 110a may be larger than in conventional systems, e.g., a millimeter or more, which may reduce the velocity/pressure of the outlet fluid flow 116 but may also reduce or eliminate the above-referenced concerns related to clogging and erosion. By similar reasoning, an overall pressure drop across the described jet impingement cooling system may be reduced, which may contribute to improved performance of the overall fluid loop in which the described jet impingement cooling system may be included. For example, the reduced pressure drop may reduce requirements related to a fluid pump being used and/or enable use of a smaller or more efficient fluid pump.

In other implementations, the factors of clogging, erosion, and pressure drop may be balanced against a total need for cooling. For example, a total amount of heat dissipation provided by the jet impingement heatsink 100 may be increased in comparison with conventional systems by virtue of the fact that the opening 110a may be closer to the semiconductor module 122 than in conventional jet impingement systems, and may therefore provide more efficient and greater cooling.

For example, in conventional systems, jet nozzles may be spaced from a device being cooled by a designated distance, over which the pressurized fluid must travel. In FIG. 1, the opening 110a is separated from the semiconductor module 122 only by the fluid channel height of the fluid channel 110b. Consequently, a fluid velocity of the outlet fluid flow from the opening(s) 110a at a surface of the semiconductor devices 124, 125 may be higher than in conventional systems having comparable nozzle diameters (and other relevant parameterizations) but spaced farther away from the semiconductor devices.

Thus, it will be appreciated that the various factors such as nozzle diameters and fluid channel height may be matters of design choice used by a designer to balance factors such as clogging/erosion/pressure drop against a total quantity of cooling needed. For example, an implementation of the jet impingement heatsink 100 of FIG. 1 having comparable nozzle diameters and a small fluid channel height may generally provide greater overall cooling than conventional jet impingement cooling systems, due both to the thermal dissipation of the jet plate 108 and the proximity of the opening(s) 110a to the semiconductor devices 124, 125.

Figure 2:
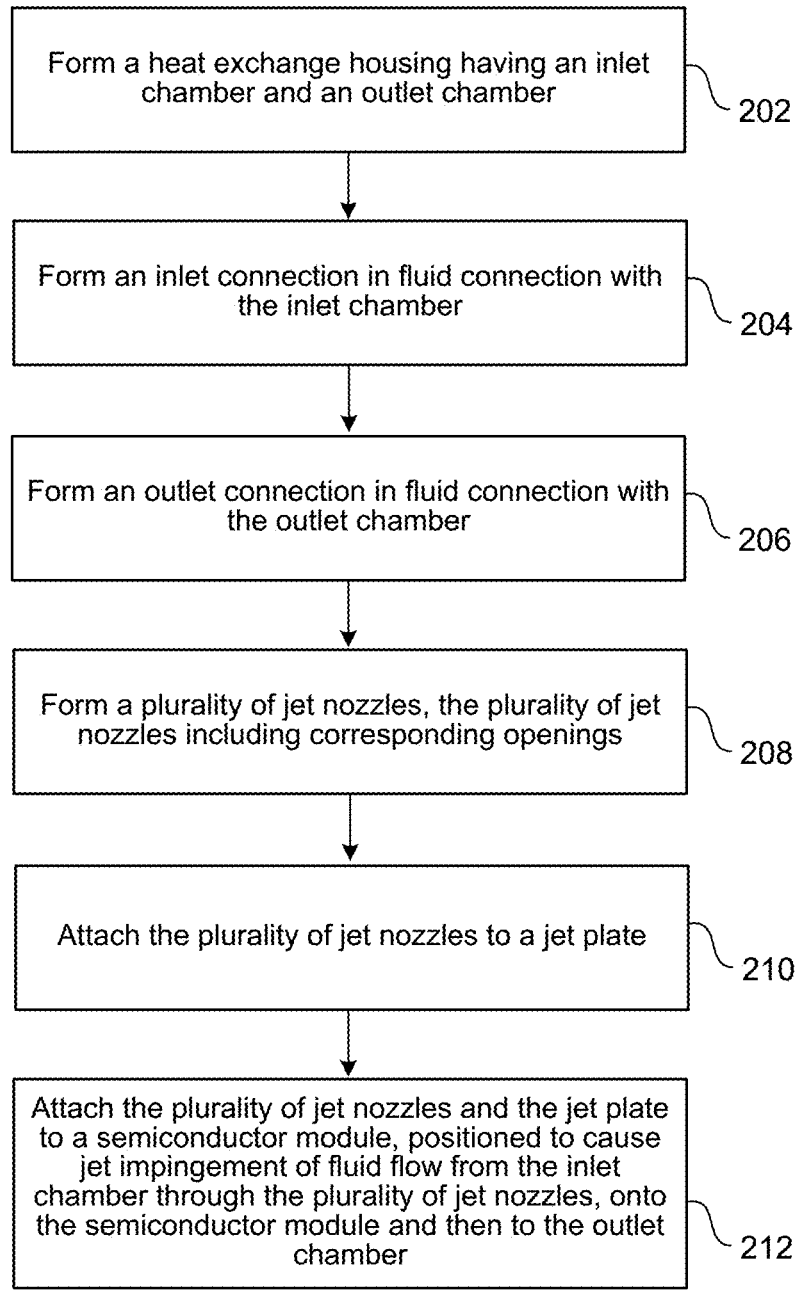
FIG. 2 is a flowchart illustrating an example manufacturing process for making a jet impingement cooling assembly, in accordance with example embodiments described herein.

FIG. 2 is a flowchart illustrating an example manufacturing process for making a jet impingement cooling assembly, in accordance with example embodiments described herein. In FIG. 2, operations 202-212 are illustrated as separate, ordered, sequential operations. However, it will be appreciated that in various example manufacturing processes, the operations 202-212 may be performed in a different order than that shown and/or may be executed partially or completely in parallel. Moreover, additional or alternative operations may be included, and/or one or more operations may be omitted.

In the example of FIG. 2, the heat exchange base 102 having the inlet chamber 112 and the outlet chamber 126 may be formed (202). An inlet connection may be formed in fluid connection with the inlet chamber 112 (204), and an outlet connection may be formed in fluid connection with the outlet chamber 126 (206), as shown, e.g., in the examples of FIGS. 17-23.

A plurality of jet nozzles 110 may be formed, the plurality of jet nozzles 110 including corresponding openings 110a (208). The plurality of jet nozzles 110 may be attached to the jet plate 108 (210). The plurality of jet nozzles 110 and the jet plate 108 may be attached to the semiconductor module 122, and positioned to cause jet impingement of fluid flow from the inlet chamber through the plurality of jet nozzles, onto the semiconductor module and then to the outlet chamber (212).

For example, as shown in FIG. 1, the jet nozzles 110 may include openings 110a that are separated from the attachment surfaces 110c by a fluid channel height of the fluid channels 110b formed in fluid connection with the openings 110a. In this way, the jet nozzles 110 may be mechanically connected to the semiconductor module 122, e.g., using a soldering or sintering process, while still enabling fluid flow of the outlet fluid flow 116.

For example, the attachment surfaces 110c may be soldered or sintered directly to corresponding semiconductor devices 124, 125, while the jet nozzles may be attached to, or formed integrally with, the jet plate 108. As also described above and illustrated in FIGS. 11-15B, the jet plate 108 may be mechanically connected to (e.g., soldered or sintered to) the semiconductor module 122, while the attachment surfaces 110c of the jet nozzles are connected to the jet plate 108. Put another way, the jet nozzles may be mechanically connected to the semiconductor module 122 either directly or indirectly (e.g., via the jet plate 108).

Thus, the devices and methods of FIGS. 1 and 2 provide, with desired levels of velocity and pressure, a cooling liquid with high accuracy and/or precision to identified hotspots of semiconductor power modules, while also providing heat dissipation using mechanically connected and thermally conductive materials. For example, described jet impingement cooling assembly embodiments provide direct contact of a cooling fluid to a backside of a substrate (e.g., direct bonded copper (DBC) substrate (e.g., a substrate including a dielectric disposed between a pair of metal layers for traces and/or bonding)) being cooled.

The described jet impingement heat exchange (cooling) assembly embodiments may be configured to provide either uniform or customized pressure(s) at each of one or more jet nozzles 110, to thereby provide desired levels of cooling to a corresponding plurality of hotspots. For example, diameters of the openings 110a may be varied to obtain desired levels of cooling at individual semiconductor devices 124, 125. The jet impingement cooling assembly is efficient, in that jet impingement occurs at least at (e.g., only at) the desired and necessary hotspots.

FIG. 3 illustrates a top view, a front view, and a cross-sectional view of an example implementation of the jet impingement heatsink for high power semiconductor devices of FIG. 1. In the example of FIG. 3, a jet impingement heatsink 300 includes a jet plate 308 and a plurality of jet nozzles 310. As in FIG. 1, each jet nozzle includes an opening 310a, a fluid channel 310b, and an attachment surface 310c.

More specifically, each of the jet nozzles 310 is illustrated as being rectangular (e.g., square), with an opening 310a formed at a center of each of the jet nozzles 310. The fluid channel 310b is a two-way fluid channel that provides an outlet fluid flow that is substantially perpendicular to inlet fluid flow through each opening 310a.

Further, the fluid channels 310b are positioned at an angle (e.g., diagonally) with respect to a vertical and/or horizontal centerline through a corresponding jet nozzle. By providing the fluid channels 310b with diagonal orientations, the design of FIG. 3 prevents outflows from one fluid channel 310b from being directed into outflows from an adjacent fluid channel 310b. In other words, collisions between adjacent outflows of adjacent fluid channels 310b may be prevented. The provided front view illustrates that the fluid channels 310b provide an exiting outlet fluid flow at a non-centered position along corresponding attachment surfaces 310c.

Further in FIG. 3, the provided cross-sectional view illustrates that the openings 310a may be provided with a tapered design, in which a diameter of the opening 310a is slightly less at a top of the opening 310a (closer to the fluid channel 310b) than at a bottom of the opening 310a (closer to the jet plate 308). By providing such a tapered opening, inlet fluid flow may be facilitated (and clogging potential reduced) by using the relatively larger opening at a mouth of the taper, while an exit velocity and pressure of the outlet fluid flow leaving the opening 310a may be controlled to a desired extent by choosing a corresponding diameter of the opening 310a at a junction of the opening 310a with the fluid channel 310b.

Figure 4:
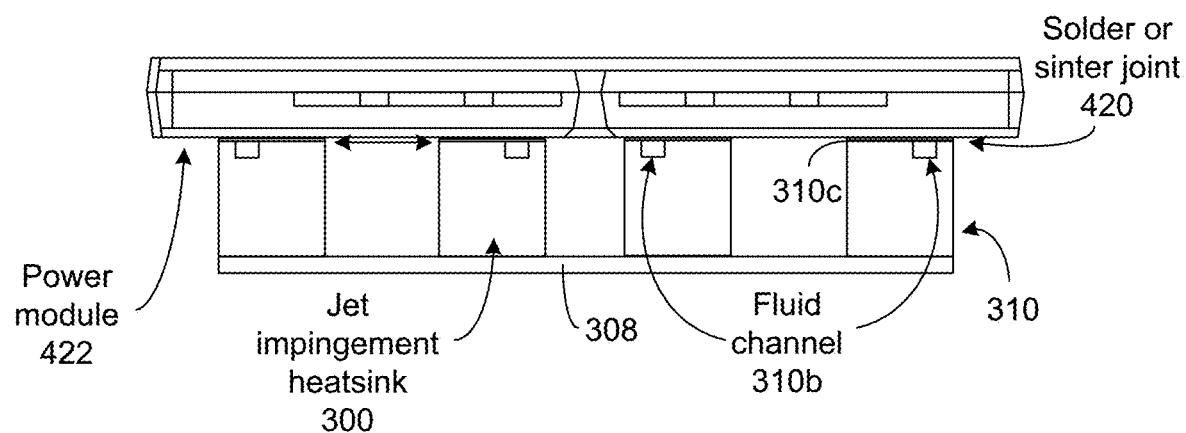
FIG. 4 illustrates a cross-sectional view of the implementation of FIG. 3, attached to a semiconductor power module.

FIG. 4 illustrates a cross-sectional view of the implementation of FIG. 3, attached to a semiconductor power module 422. As shown in FIG. 4, the jet nozzles 310 may be attached to the semiconductor power module 422 using a solder or sinter joint 420 that is provided between the attachment surface 310c and a surface of the semiconductor power module 422.

Figure 5:
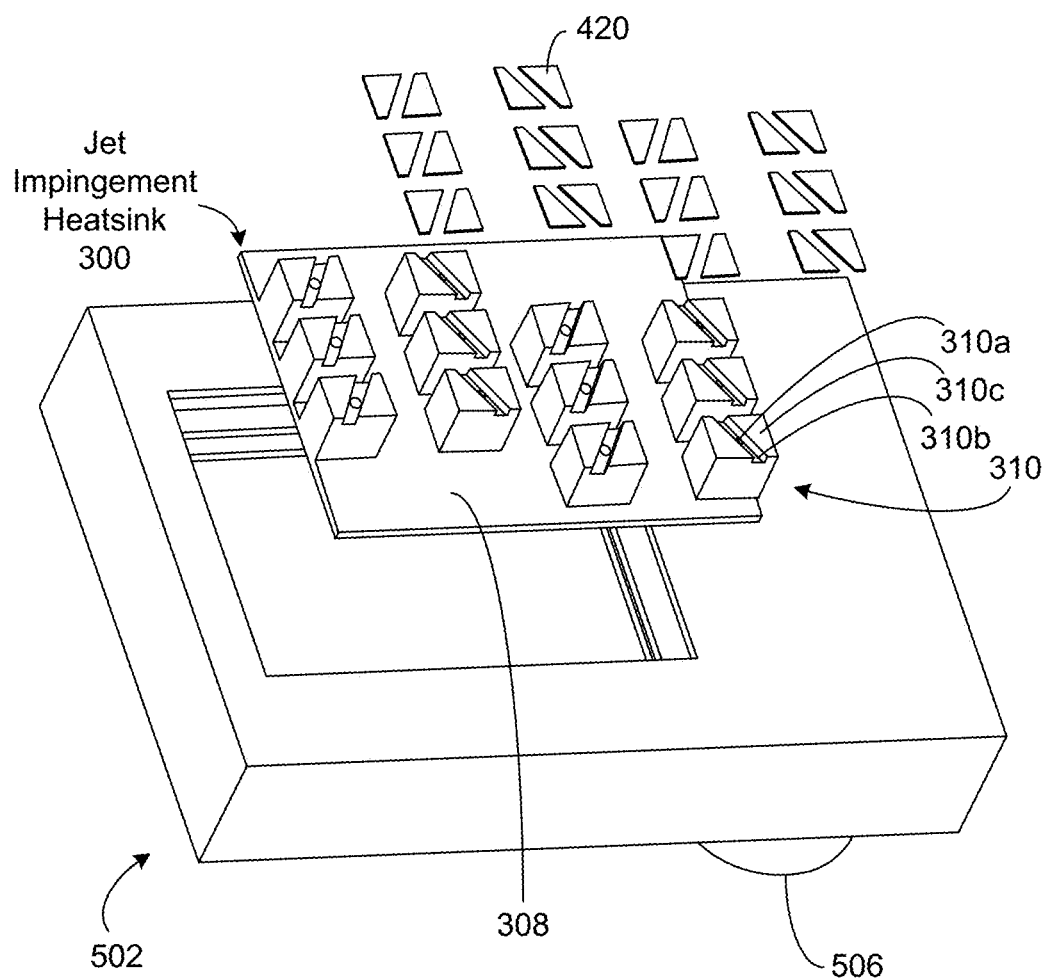
FIG. 5 is an exploded view of the implementation of FIG. 3 illustrating an example heat exchange base.

FIG. 5 is an exploded view of the implementation of FIG. 3 illustrating an example heat exchange base 502. FIG. 5 illustrates that the heat exchange base 502 may include an opening to receive the jet impingement heatsink 300. In the view of FIG. 5, an outlet connection 506 is visible, while an inlet connection may be disposed adjacent to the outlet connection 506 but is not visible in FIG. 5. As illustrated and described in more detail, below, with respect to FIG. 17, the heat exchange base 502 enables fluid flow through the inlet connection and into an inlet chamber formed by the positioning of the jet impingement heatsink 300 within the opening of the heat exchange base 502, through the openings 310a, and onto a semiconductor power module, such as the semiconductor power module 422 of FIG. 4. Then, as described, the fluid flow may proceed through the fluid channels 310b and into an outlet chamber formed by the positioning of the jet impingement heatsink 300 within the opening of the heat exchange base 502, and from there through the outlet connection 506.

Figure 6A:
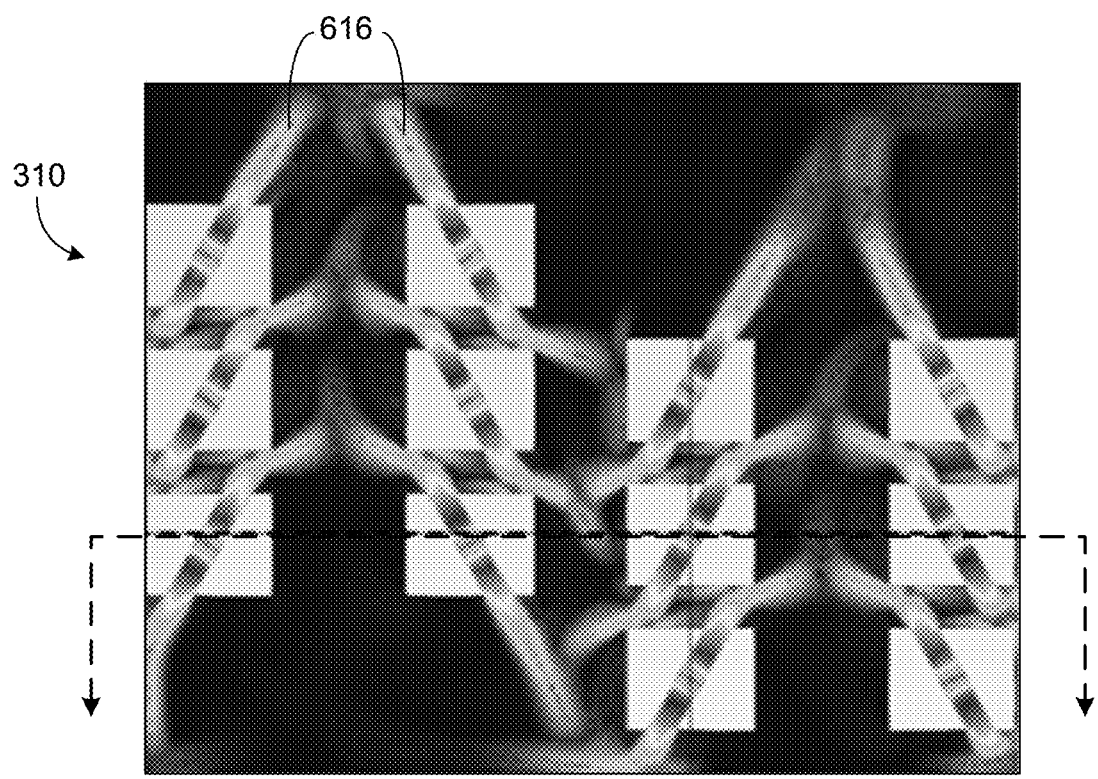
FIG. 6A illustrates a top view of an example fluid velocity contour of the implementation of FIG. 3.

FIG. 6A illustrates a top view of an example fluid velocity contour of the implementation of FIG. 3. As just described, FIG. 6A illustrates outlet fluid flow 616 exiting the fluid channels 310b. As also described above, FIG. 6A illustrates that the outlet fluid flows 616 are prevented from colliding with one another by virtue of the angled positions of the fluid channels 310b.

Figure 6B:
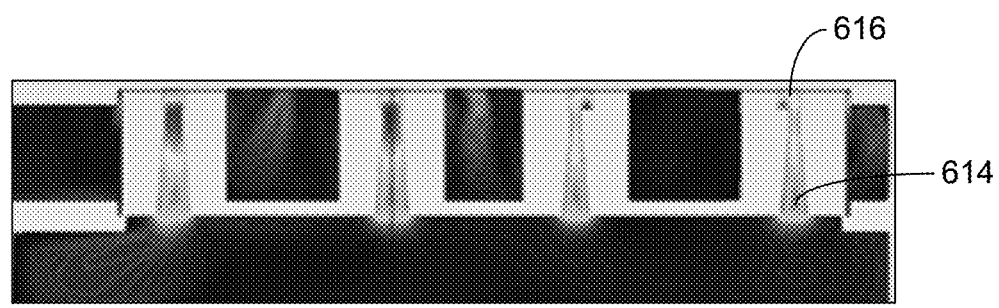
FIG. 6B illustrates a front view of the example fluid velocity contour of FIG. 6A.

FIG. 6B illustrates a front view of the example fluid velocity contour of FIG. 6A. FIG. 6B illustrates an inlet fluid flow 614 that enters through wider portions of tapered openings 310a with a first velocity and exits through narrower portions of the tapered openings 310a with a higher velocity.

FIG. 7 illustrates a top view, a transparent front view, and a cross-sectional view of a second example implementation of the jet impingement heatsink for high power semiconductor devices of FIG. 1. In the example of FIG. 7, a jet impingement heatsink 700 includes a jet plate 708 and a plurality of jet nozzles 710. As in FIGS. 1 and 3, each jet nozzle includes an opening 710a, a fluid channel 710b, and an attachment surface 710c.

More specifically, each of the jet nozzles 310 is illustrated as being rectangular (e.g., square), with an opening 710a formed at a center of each of the jet nozzles 710. In FIG. 7, in contrast with the example of FIG. 3, the fluid channel 310b is a one-way fluid channel that provides an outlet fluid flow that is substantially perpendicular to inlet fluid flow through each opening 710a.

Similar to the example of FIG. 3, the fluid channels 710b are positioned at an angle (e.g., diagonally) with respect to a vertical and/or horizontal centerline through a corresponding jet nozzle. By providing the fluid channels 710b with diagonal orientations, the design of FIG. 7 prevents outflows from one fluid channel 710b from being directed into outflows from an adjacent fluid channel 710b. In other words, collisions between adjacent outflows of adjacent fluid channels 710b may be prevented. The provided transparent front view illustrates that the fluid channels 710b provide an exiting outlet fluid flow at a non-centered position along corresponding attachment surfaces 710c.

Further in FIG. 7, the provided cross-sectional view illustrates that the openings 710a may be provided with the tapered design described with respect to FIGS. 3-6B, in which a diameter of the opening 710a is slightly less at a top of the opening 710a (closer to the fluid channel 710b) than at a bottom of the opening 710a (closer to the jet plate 708).

Figure 8:
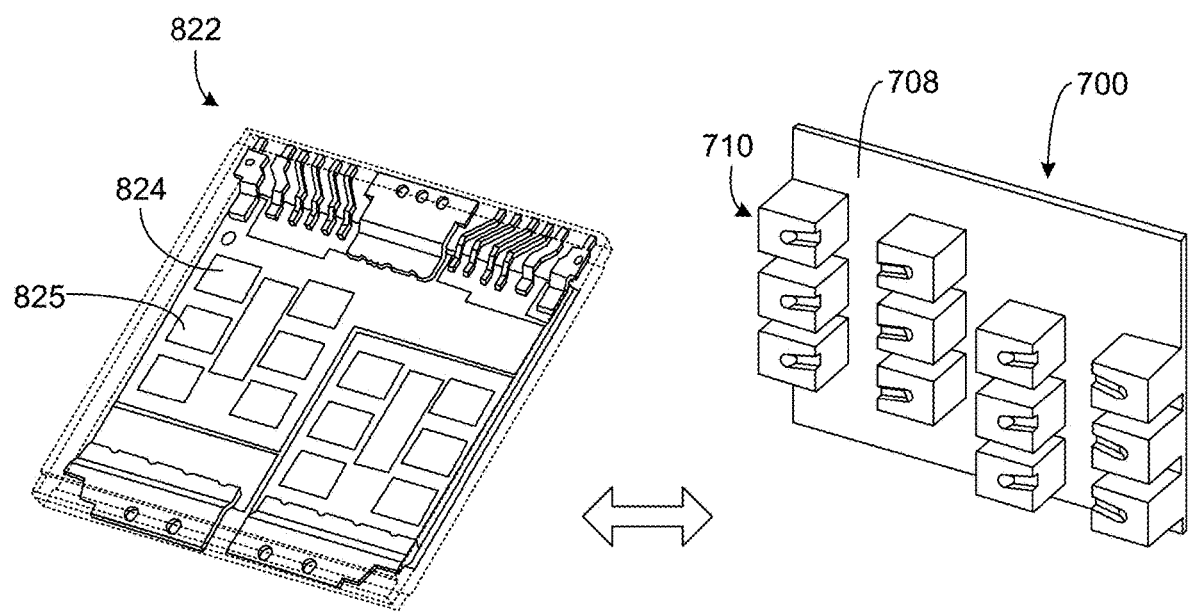
FIG. 8 illustrates an exploded view of the implementation of FIG. 7, and a corresponding plurality of high-power semiconductor devices to be cooled.

FIG. 8 illustrates an exploded view of the implementation of FIG. 7, and a corresponding plurality of high-power semiconductor devices to be cooled. Specifically, FIG. 8 illustrates a semiconductor power module 822, which includes a total of 6 semiconductor power devices to be cooled. In FIG. 8, devices 824, 825 are illustrated to show correspondence with the devices 124, 125 of the semiconductor module 122 of FIG. 1.

As illustrated in FIG. 8, the various jet nozzles 710 may thus be positioned on the jet plate 708 to correspond directly to positions of the various semiconductor devices of the semiconductor power module 822. Thus, the described jet impingement heatsink 700 is efficient, in that jet impingement occurs at least at (e.g., only at) the desired and necessary hotspots.

Figure 9:
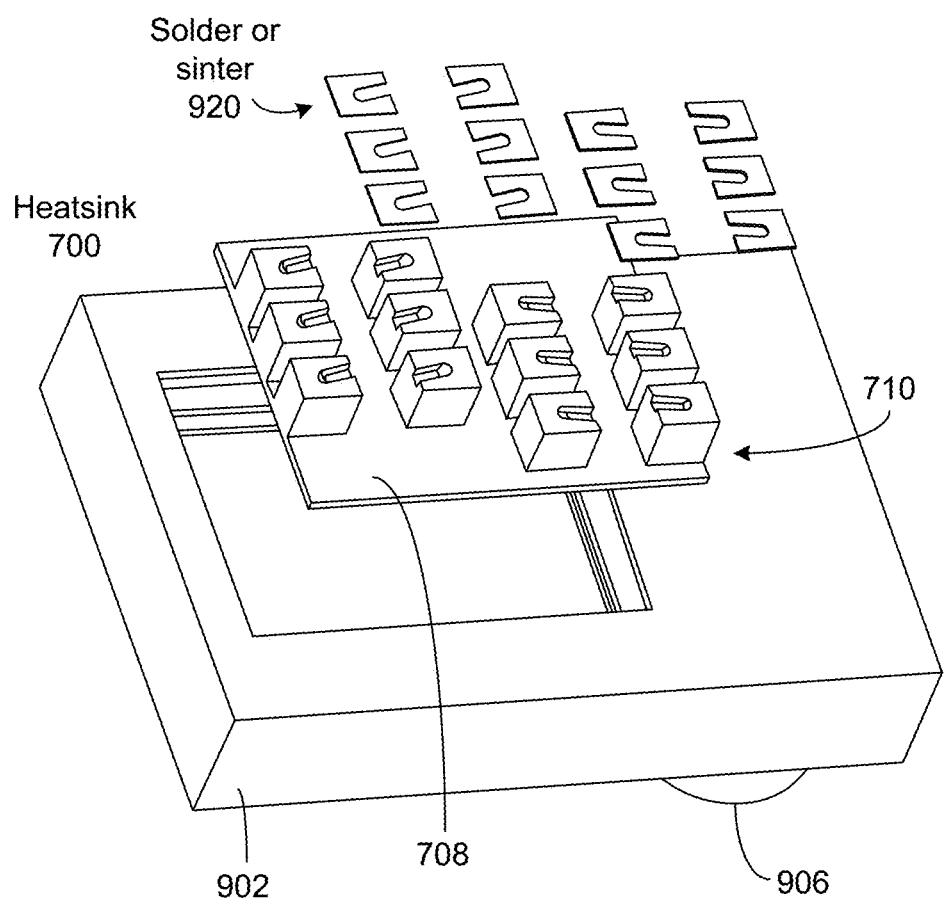
FIG. 9 is an exploded view of the implementation of FIG. 7 illustrating an example heat exchange base.

FIG. 9 is an exploded view of the implementation of FIG. 7 illustrating an example heat exchange base 902. FIG. 9 illustrates that the heat exchange base 902 may include an opening to receive the jet impingement heatsink 700. In the view of FIG. 9, an outlet connection 906 is visible, while an inlet connection may be disposed adjacent to the outlet connection 906 but is not visible in FIG. 9. As referenced with respect to FIG. 5, and as illustrated and described in more detail, below, with respect to FIG. 17, the heat exchange base 902 enables fluid flow through the inlet connection and into an inlet chamber formed by the positioning of the jet impingement heatsink 700 within the opening of the heat exchange base 902, through the openings 710a, and onto a semiconductor power module, such as the semiconductor power module 822 of FIG. 8. Then, as described, the fluid flow may proceed through the fluid channels 710b and into an outlet chamber formed by the positioning of the jet impingement heatsink 700 within the opening of the heat exchange base 902, and from there through the outlet connection 906.

Figure 10A:
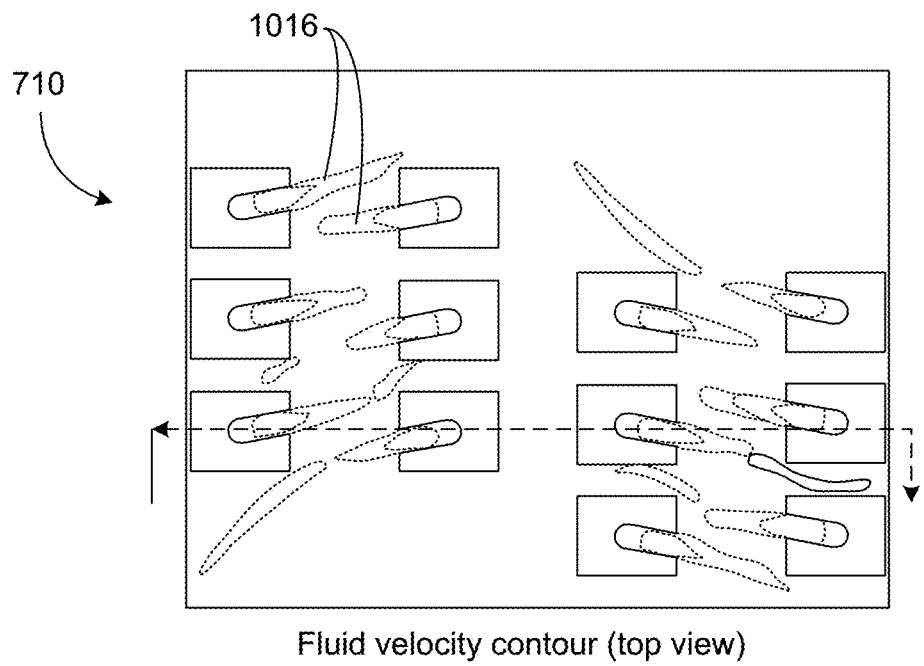
FIG. 10A illustrates a top view of an example fluid velocity contour of the implementation of FIG. 7.

FIG. 10A illustrates a top view of an example fluid velocity contour of the implementation of FIG. 7. As just described, FIG. 10A illustrates outlet fluid flow 1016 exiting the fluid channels 710b. As also described above, FIG. 10A illustrates that the outlet fluid flows 1016 are prevented from colliding with one another by virtue of the angled positions of the fluid channels 710b.

Figure 10B:
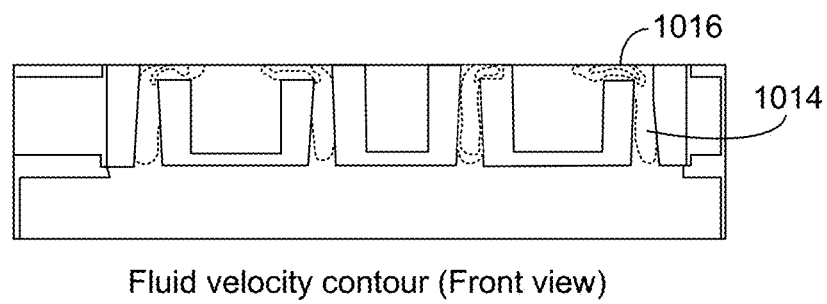
FIG. 10B illustrates a front view of the example fluid velocity contour of FIG. 10A.

FIG. 10B illustrates a front view of the example fluid velocity contour of FIG. 10A. FIG. 10B illustrates an inlet fluid flow 1014 that enters through wider portions of tapered openings 710a with a first velocity and exits through narrower portions of the tapered openings 710a with a higher velocity.

FIG. 11 illustrates an isometric view of a third example implementation of the jet impingement heatsink for high power semiconductor devices of FIG. 1. In FIG. 11, a jet impingement heatsink 1100 includes a jet plate 1108 that is connected to, or includes, attachment surfaces 1110c of a corresponding plurality of jet nozzles 1110. Openings 1110a through the jet nozzles 1110 may be in fluid connection with fluid channels 1110b. As shown in more detail below, e.g., with respect to FIGS. 13 and 14, positioning the jet plate 1108 at the attachment surface 1110c provides a relatively large surface area to be used when soldering or sintering the jet impingement heatsink 1100 to a semiconductor power module. In other words, by soldering or sintering the jet plate 1108 to the semiconductor power module, a more secure mechanical connection of the jet impingement heatsink 1100 to a semiconductor power module may be obtained, and improved thermal dissipation may be provided, as compared, e.g., to the example jet impingement heatsinks of FIGS. 3 and 7.

Figure 12:
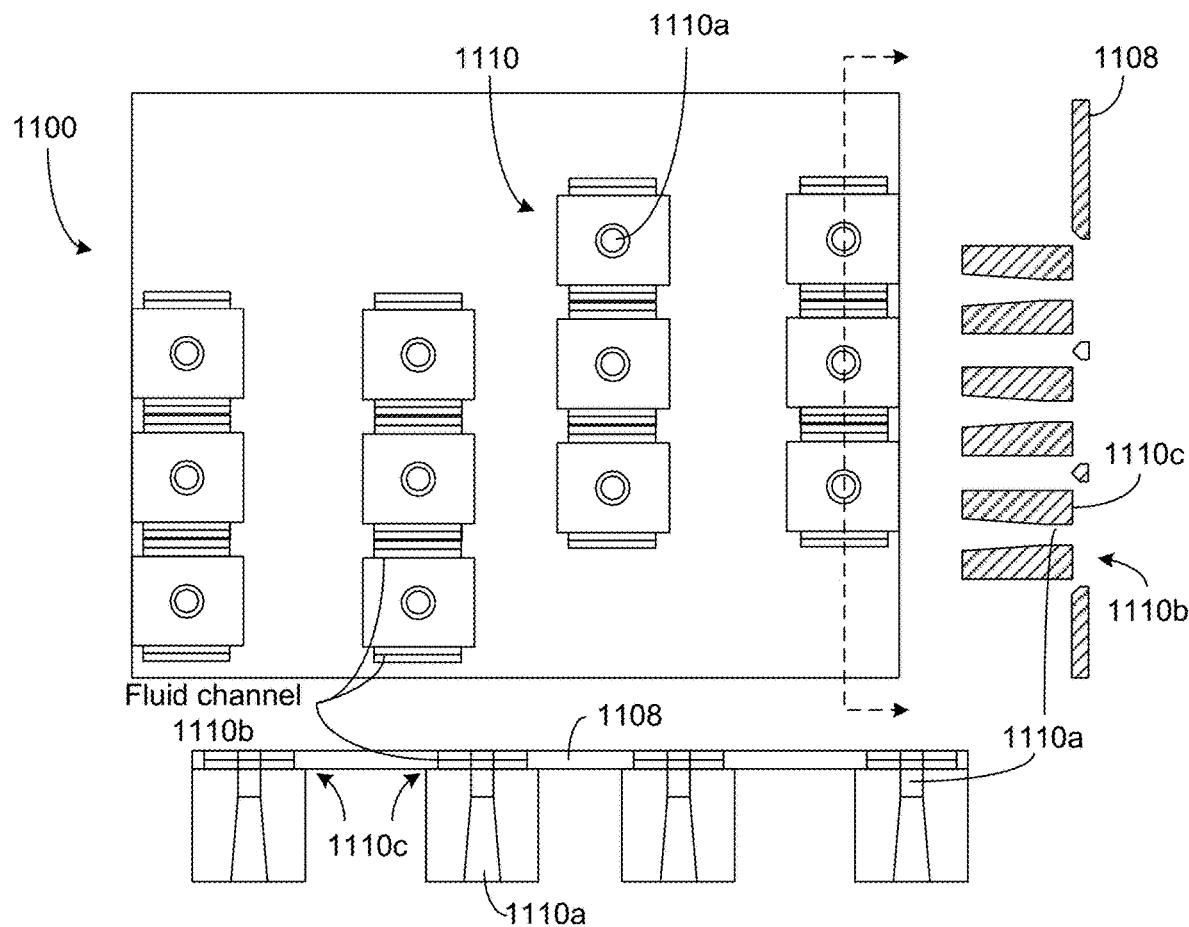
FIG. 12 illustrates a bottom view, a transparent front view, and a cross-sectional view of a third example implementation of the jet impingement heatsink for high power semiconductor devices of FIG. 11.

FIG. 12 illustrates a bottom view, a transparent front view, and a cross-sectional view of a third example implementation of the jet impingement heatsink for high power semiconductor devices of FIG. 11. In the example of FIG. 12, the jet nozzles 1110 of the jet impingement heatsink 1100 are illustrated with respective openings 1110a (which are tapered as described above) being disposed to receive an incoming inlet fluid flow.

As shown in the various views of FIGS. 11 and 12, the fluid channels 1110b extend past a perimeter of the jet nozzles 1110 (e.g., past an attachment surface 1110c of the jet nozzles 1110), so that an outlet fluid flow may proceed from the fluid channels 1110b in a direction past the walls/bodies of the jet nozzles 1110 and thereby to an outlet connection. In the specific examples shown, the fluid channels 1110b are formed in a "I" or "H" shape in which outlet fluid flow proceeds through a central channel portion of the fluid channel 1110b and exits through perpendicular channel portions that are perpendicular to the central channel portion.

Figure 13:
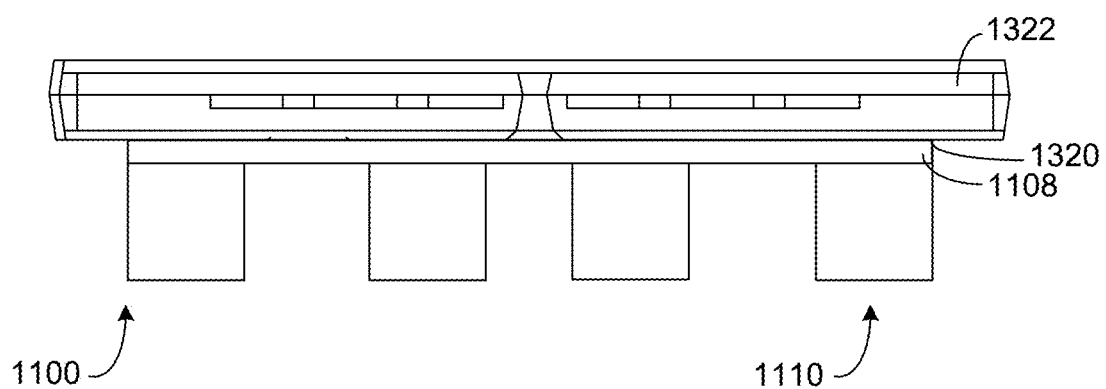
FIG. 13 illustrates a cross-sectional view of the implementation of FIG. 11, attached to a plurality of high power semiconductor devices.

FIG. 13 illustrates a cross-sectional view of the implementation of FIG. 11, attached to a semiconductor power module 1322. As shown in FIG. 13, the jet nozzles 1110 may be attached to the semiconductor power module 1322 using a solder or sinter joint 1320. Specifically, as shown, the jet nozzles 1110 may be attached indirectly by soldering or sintering the jet plate 1108 to a surface of the semiconductor power module 1322.

Figure 14:
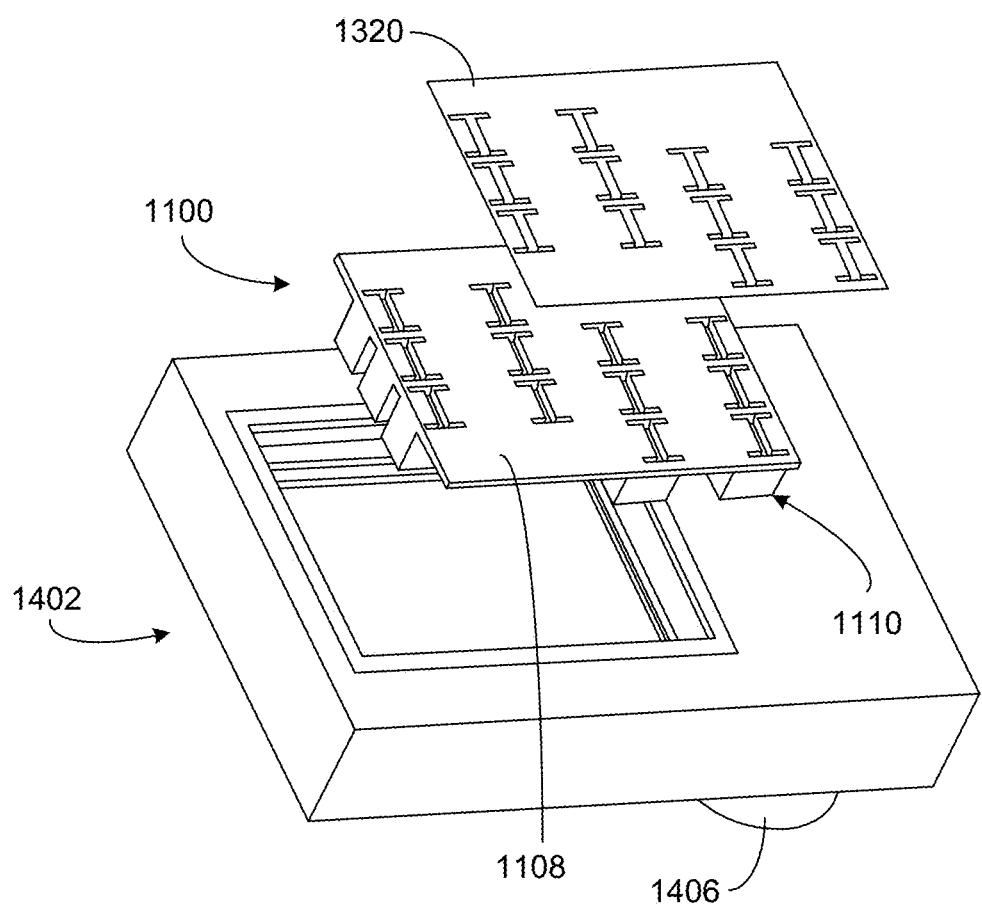
FIG. 14 is an exploded view of the implementation of FIG. 11 illustrating an example heat exchange base.

FIG. 14 is an exploded view of the implementation of FIG. 11 illustrating an example heat exchange base 1402. FIG. 14 illustrates that the heat exchange base 1402 may include an opening to receive the jet impingement heatsink 1100. In the view of FIG. 14, an outlet connection 1406 is visible, while an inlet connection may be disposed adjacent to the outlet connection 1406 but is not visible in FIG. 14. As referenced above and described in more detail, below, with respect to FIG. 18, the heat exchange base 1402 enables fluid flow through the inlet connection and into an inlet chamber formed by the positioning of the jet impingement heatsink 1100 within the opening of the heat exchange base 1402, through the openings 1110a, and onto a semiconductor power module, such as the semiconductor power module 1322 of FIG. 13. Then, as described, the fluid flow may proceed through the fluid channels 1110b and into an outlet chamber formed by the positioning of the jet impingement heatsink 1100 within the opening of the heat exchange base 1402, and from there through the outlet connection 1406.

FIG. 14 further illustrates that solder or sinter 1320 may be applied over a larger surface area than in, e.g., the examples of FIGS. 5 and 9. That is, as shown, solder or sinter 1320 may be applied over much of the jet plate 1108, to provide a secure and stable connection to the semiconductor power module 1322 of FIG. 13.

Figure 15A:
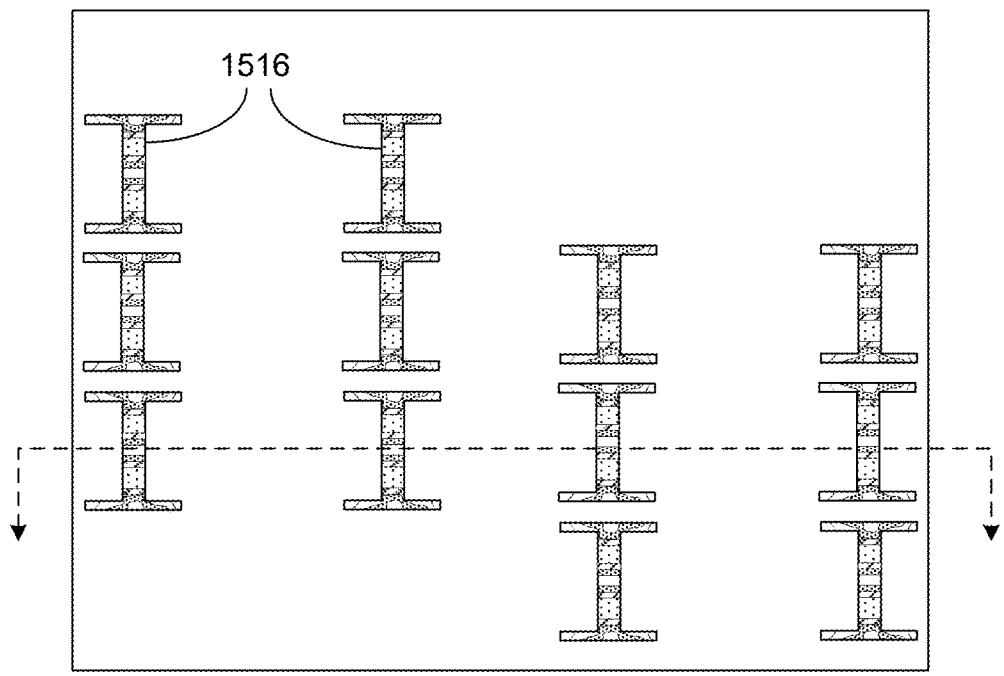
FIG. 15A illustrates a top view of an example fluid velocity contour of the implementation of FIG. 11.

FIG. 15A illustrates a top view of an example fluid velocity contour of the implementation of FIG. 11. As just described, FIG. 15A illustrates outlet fluid flow 1516 exiting the fluid channels 1110b. As also described above, FIG. 15A illustrates that the outlet fluid flows 1516 are prevented from colliding with one another by virtue of exiting through the perpendicular channel portions of the fluid channels 1110*b*.

Figure 15B:
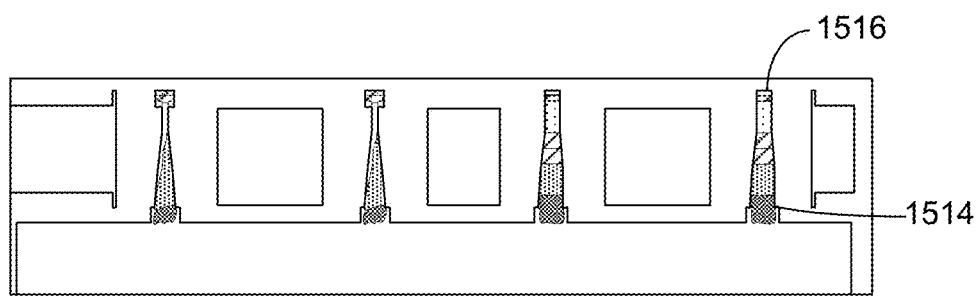

FIG. 15B illustrates a front view of the example fluid velocity contour of FIG. 15A. FIG. 15B illustrates an inlet fluid flow 1514 that enters through wider portions of tapered openings 1110*a* with a first velocity and exits through narrower portions of the tapered openings 1110*a* with a higher velocity.

Figure 16:
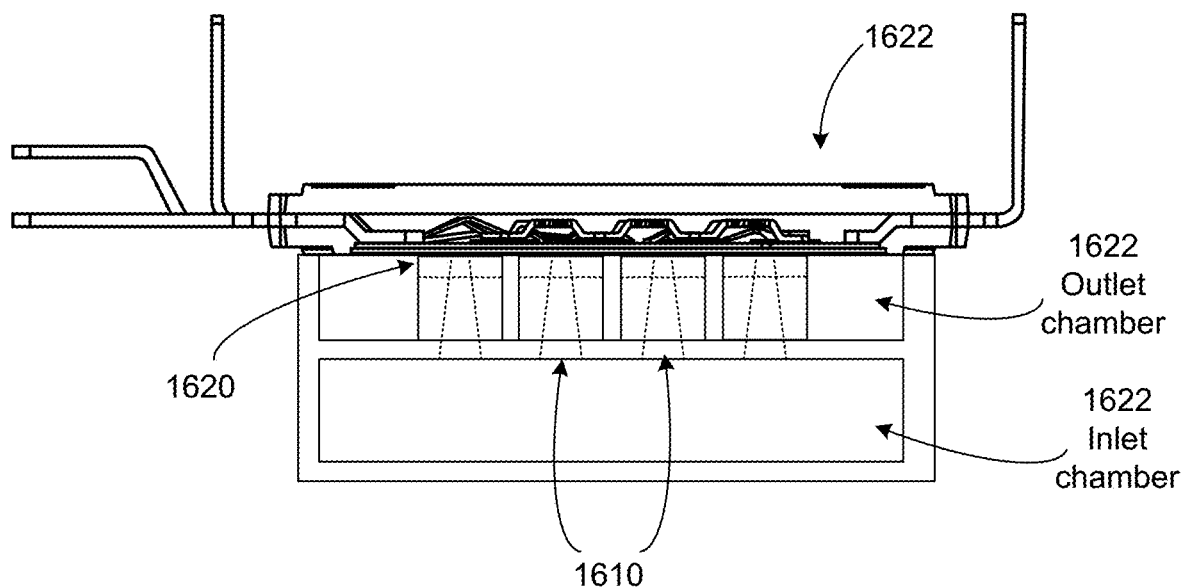
FIG. 16 illustrates a cross-sectional view of an example heat exchange base that may be used with the example implementations of FIGS. 3-15B.

FIG. 16 illustrates a cross-sectional view of an example heat exchange base that may be used with the example implementations of FIGS. 3-15B. As shown, an inlet chamber 1612 may be positioned to enable fluid flow through jet nozzles 1610, onto a semiconductor power module 1622, and out into an outlet chamber 1626. The jet nozzles 1610 are connected to the semiconductor power module 1622 using a soler or sinter joint 1620.

Figure 17:
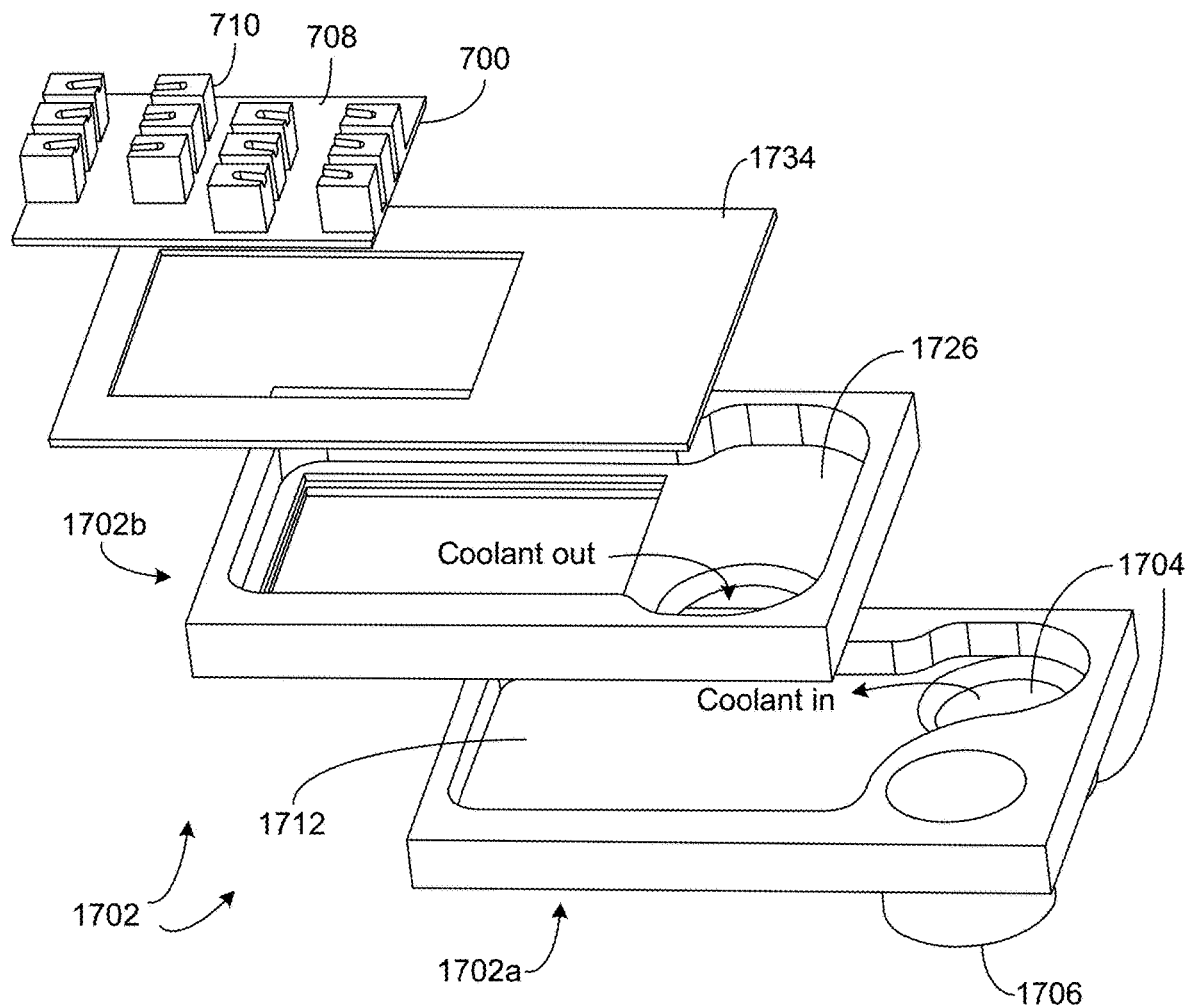
FIG. 17 illustrates an exploded view of the example heat exchange base of FIG. 16, used with the example implementation of FIGS. 7-10B.

FIG. 17 illustrates an exploded view of the example heat exchange base of FIG. 16, used with the example implementation of FIGS. 7-10B. In the example of FIG. 17, a heat exchange base 1702 includes a lower cooling jacket 1702*a* with an inlet connection 1704 for receiving an inlet fluid flow, and an outlet connection 1706 for outputting an outlet fluid flow. An inlet chamber 1712 is defined by an upper cooling jacket 1702*b*, a cover layer 1734, and the jet impingement heatsink 700. An outlet chamber 1726 is defined by positioning of the jet impingement heatsink 700 and the cover layer 1734. It will be appreciated that the jet impingement heatsink 300 of FIG. 3 may be substituted for the jet impingement heatsink 700 in the example of FIG. 17.

Figure 18:
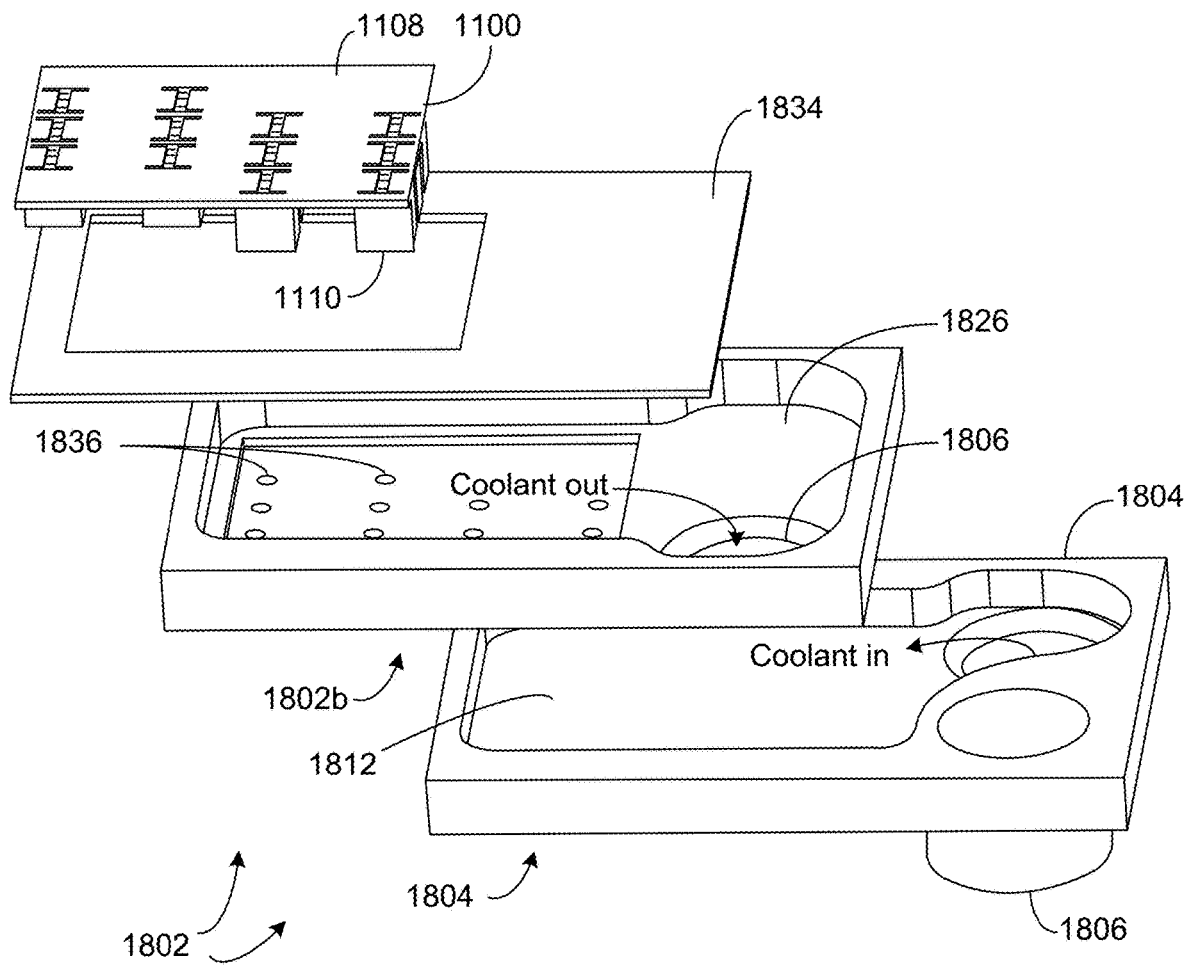
FIG. 18 illustrates an exploded view of the example heat exchange base of FIG. 16, used with the example implementation of FIGS. 11-15B.

FIG. 18 illustrates an exploded view of the example heat exchange base of FIG. 16, used with the example implementation of FIGS. 11-15B. In the example of FIG. 18, a heat exchange base 1802 includes a lower cooling jacket 1802*a* with an inlet connection 1804 for receiving an inlet fluid flow, and an outlet connection 1806 for outputting an outlet fluid flow. An inlet chamber 1812 is defined by an upper cooling jacket 1802*b*, a cover layer 1834, and the jet impingement heatsink 1100. An outlet chamber 1826 is defined by positioning of the jet impingement heatsink 1100 and the cover layer 1834.

In the example of FIG. 18, the jet plate 1108 of the jet impingement heatsink 1100 is positioned for attachment to a semiconductor power module, as illustrated in FIG. 14. To ensure efficient fluid transfer from the inlet chamber 1812 through the jet nozzles 1110, holes 1836 may be provided in a floor of the upper cooling jacket, as shown.

Figure 19:
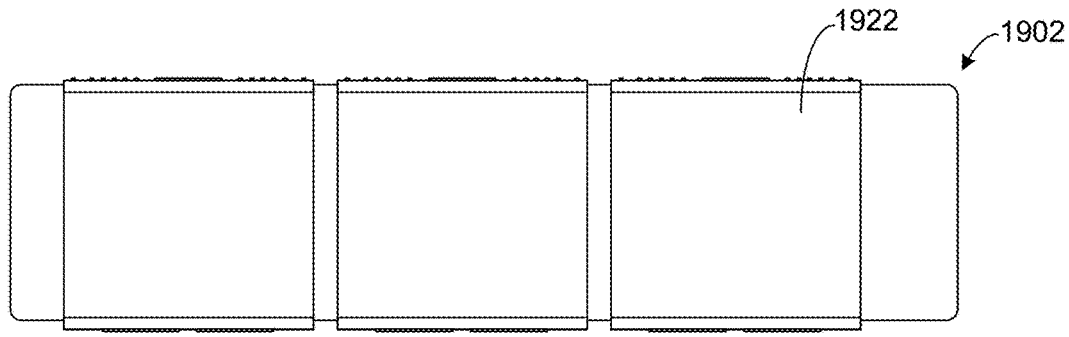
FIG. 19 is a top view of an example implementation of a jet impingement cooling assembly in accordance with the example of FIG. 1.
Figure 20:
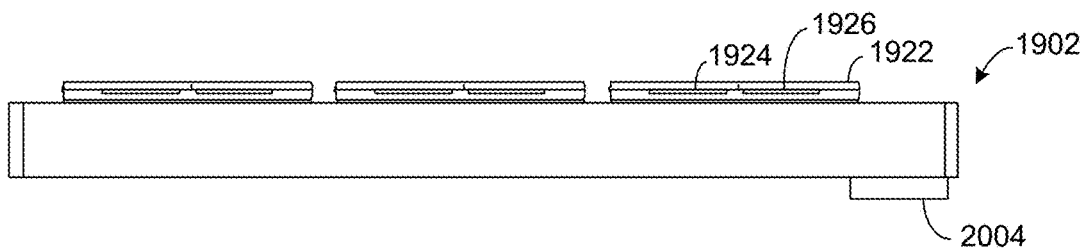
FIG. 20 is a front view of the example implementation of FIG. 19.
Figure 21:
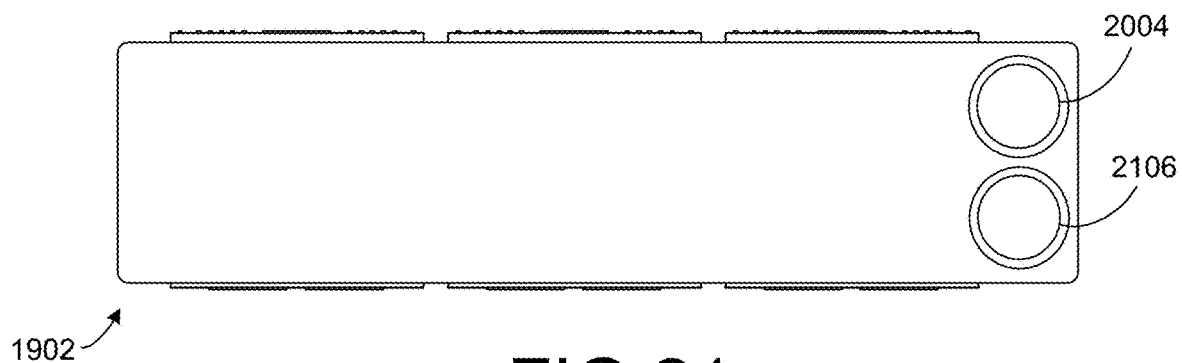
FIG. 21 is a bottom view of the example implementation of FIG. 19.
Figure 22:
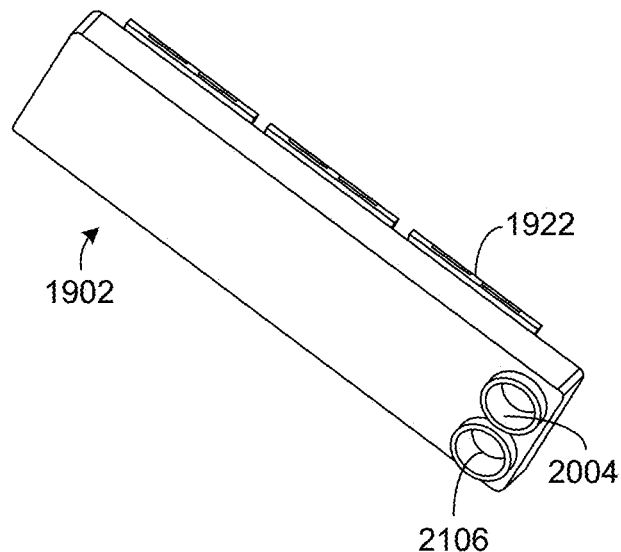
FIG. 22 is an isometric bottom view of the example implementation of FIG. 19.

FIG. 19 is a top view of an example implementation of a jet impingement cooling assembly in accordance with the example of FIG. 1. FIG. 20 is a front view of the example implementation of FIG. 19. FIG. 21 is a bottom view of the example implementation of FIG. 19. FIG. 22 is an isometric bottom view of the example implementation of FIG. 19.

In the examples of FIGS. 19-23, a heat exchange base 1902 is used to provide jet impingement cooling to three semiconductor power modules 1922, which may include semiconductor devices 1924 and 1926. An inlet connection 2004 and an outlet connection 2106 may be provided at one end of the heat exchange base 1902.

Figure 23:
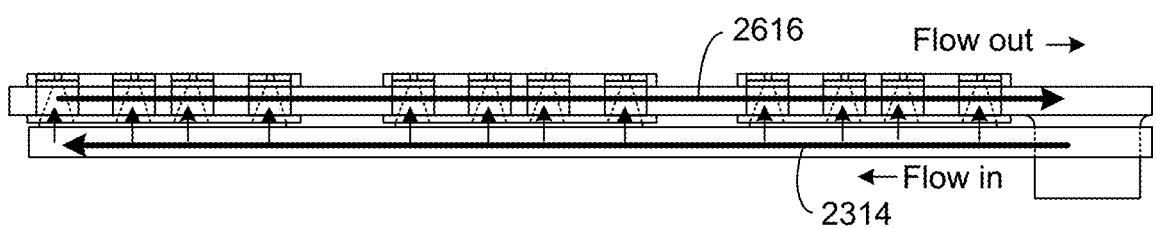
FIG. 23 is a transparent front view illustrating fluid flow in the example implementation of FIG. 19.

FIG. 23 is a transparent front view illustrating fluid flow in the example implementation of FIG. 19. In FIG. 23, an inlet fluid flow 2314 is illustrated as proceeding through the inlet connection 2004. After proceeding through any of the jet impingement heatsinks described above to cool the semiconductor power modules 1922, the coolant proceeds as an outlet fluid flow 2316 to the outlet connection 2106.

Figure 24:
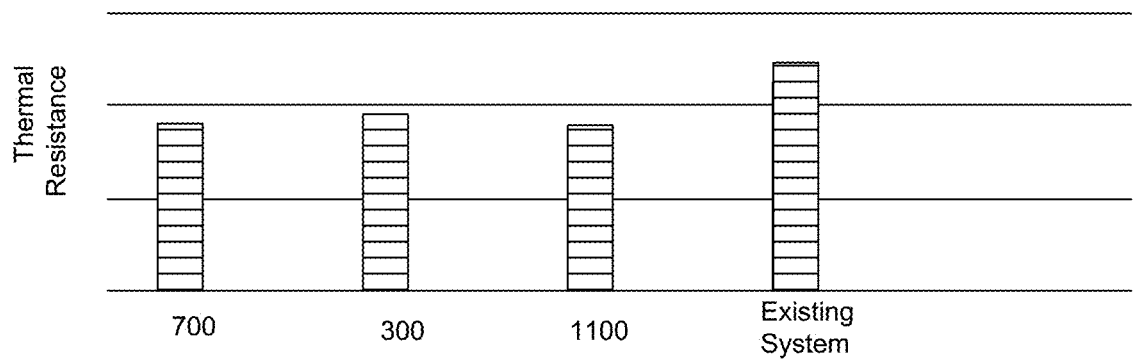
FIG. 24 is a first graph demonstrating improved cooling provided by the various embodiments described herein, as compared to conventional techniques.

FIG. 24 is a first graph demonstrating improved cooling provided by the various embodiments described herein, as compared to conventional techniques. FIG. 24 illustrates that the embodiments 300, 700, and 1100 have a thermal resistance that is lower than two conventional cooling techniques.

Figure 25:
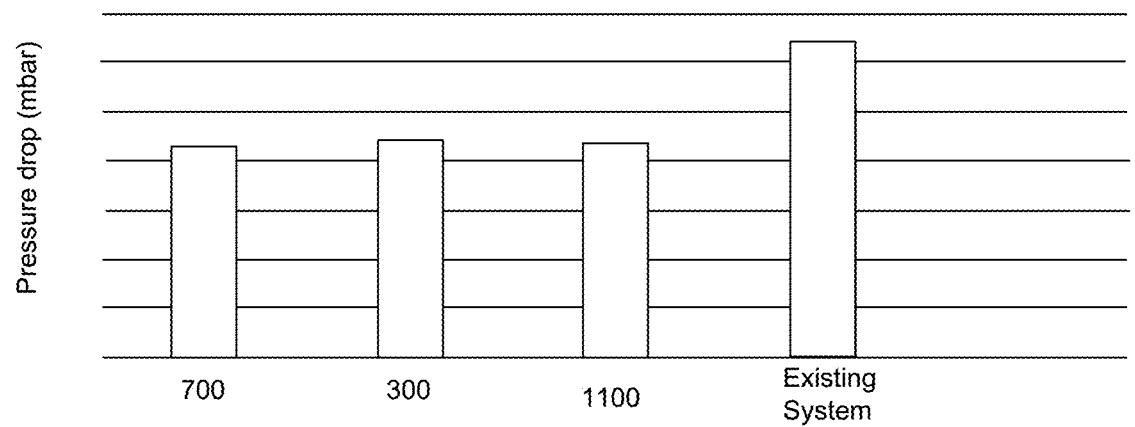
FIG. 25 is a second graph demonstrating improved cooling provided by the various embodiments described herein, as compared to conventional techniques.

FIG. 25 is a second graph demonstrating improved cooling provided by the various embodiments described herein, as compared to conventional techniques. In FIG. 25, the embodiments 300, 700, and 1100 are shown to have a lower pressure drop than the pressure drop(s) that occurs when the two illustrated conventional techniques are used.

Described techniques provide efficient, reliable, and cost-effective cooling of semiconductor devices. Maximum temperatures of semiconductor devices may be constrained to a desired extent, and temperature variations may be minimized (that is, consistent temperatures may be maintained across multiple heat sources).

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A jet impingement cooling assembly for semiconductor devices, comprising:
   a heat exchange base having an inlet chamber and an outlet chamber;
   an inlet connection in fluid connection with the inlet chamber;
   an outlet connection in fluid connection with the outlet chamber; and
   a plurality of jet nozzles directly attached to at least one semiconductor module, at least one of the plurality of jet nozzles having a fluid channel formed therein and including at least one opening positioned to cause jet impingement of fluid flow from the inlet chamber onto the at least one semiconductor module and then through the fluid channel into the outlet chamber.

2. The jet impingement cooling assembly for semiconductor devices of claim 1, wherein the fluid channel is perpendicular to a direction of fluid flow through the at least one opening, and parallel to a surface of the at least one semiconductor module.

3. The jet impingement cooling assembly for semiconductor devices of claim 1, wherein each fluid channel is angled to prevent fluid collisions between adjacent jet nozzles.

4. The jet impingement cooling assembly for semiconductor devices of claim 1, wherein the fluid channel includes at least two fluid connections between the at least one opening and the outlet chamber.

5. The jet impingement cooling assembly for semiconductor devices of claim 1, further comprising:
   a jet plate attached to the plurality of jet nozzles, with the jet plate and the plurality of jet nozzles providing a jet impingement heatsink that disperses heat resulting from operations of the at least one semiconductor module.

6. The jet impingement cooling assembly for semiconductor devices of claim 5, wherein the jet plate is attached to distal ends of the plurality of jet nozzles with respect to the at least one semiconductor module.

7. The jet impingement cooling assembly for semiconductor devices of claim 5, wherein the jet plate is attached to proximal ends of the plurality of jet nozzles with respect to the at least one semiconductor module, and to the at least one semiconductor module.

8. The jet impingement cooling assembly for semiconductor devices of claim 1, wherein the plurality of jet nozzles are soldered to the at least one semiconductor module.

9. The jet impingement cooling assembly for semiconductor devices of claim 1, wherein the plurality of jet nozzles are sintered to the at least one semiconductor module.

10. The jet impingement cooling assembly for semiconductor devices of claim 1, wherein the at least one opening is tapered in a direction of the at least one semiconductor module.

11. A jet impingement heatsink for jet impingement cooling of at least one semiconductor device, comprising:
    a jet plate configured to be received within a heat exchange base; and
    a plurality of jet nozzles attached to the jet plate and to the at least one semiconductor device to thereby provide a thermally conductive path between the at least one semiconductor device and the jet plate,
    wherein the jet plate and the plurality of jet nozzles, when received within the heat exchange base, define a fluid flow from an inlet chamber of the heat exchange base through the plurality of jet nozzles and onto the at least one semiconductor device, and to an outlet chamber of the heat exchange base.

12. The jet impingement heatsink for jet impingement cooling of at least one semiconductor device of claim 11, wherein each jet nozzle of the plurality of jet nozzles includes a fluid channel that is perpendicular to a direction of fluid flow through the plurality of jet nozzles, and parallel to a surface of the at least one semiconductor device to which the plurality of jet nozzles are attached.

13. The jet impingement heatsink for jet impingement cooling of at least one semiconductor device of claim 11, wherein the jet plate is attached to distal ends of the plurality of jet nozzles with respect to the at least one semiconductor device.

14. The jet impingement heatsink for jet impingement cooling of at least one semiconductor device of claim 11, wherein the jet plate is attached to proximal ends of the plurality of jet nozzles with respect to the at least one semiconductor device.

15. The jet impingement heatsink for jet impingement cooling of at least one semiconductor device of claim 11, wherein the plurality of jet nozzles are soldered to the at least one semiconductor device.

16. The jet impingement heatsink for jet impingement cooling of at least one semiconductor device of claim 11, wherein the plurality of jet nozzles are sintered to the at least one semiconductor device.

17. A method of making a jet impingement heatsink for semiconductor devices, comprising:
    attaching a jet plate to a plurality of jet nozzles at first ends of the plurality of jet nozzles; and
    attaching second ends of the plurality of jet nozzles, distal from the first ends, directly to at least one semiconductor device.

18. The method of claim 17, comprising:
    forming a heat exchange base having an inlet chamber and an outlet chamber;
    forming an inlet connection in fluid connection with the inlet chamber;
    forming an outlet connection in fluid connection with the outlet chamber; and
    coupling the jet plate and attached jet nozzles to the inlet chamber to define a fluid flow from the inlet chamber through the plurality of jet nozzles and onto the at least one semiconductor device, and then to the outlet chamber.

19. The method of claim 18, further comprising:
    forming, in each jet nozzle of the plurality of jet nozzles, a fluid channel that is perpendicular to a direction of fluid flow through the jet nozzle, and parallel to a surface of the at least one semiconductor device to which the plurality of jet nozzles are attached.

20. The method of claim 18, wherein the attaching the jet plate and the plurality of jet nozzles to the at least one semiconductor device comprises:
    soldering or sintering at least one of the jet plate and the plurality of jet nozzles to the at least one semiconductor device.

* * * * *